(12) United States Patent
Lu et al.

(10) Patent No.: US 10,613,670 B2
(45) Date of Patent: Apr. 7, 2020

(54) DISPLAY PANEL AND DISPLAY DEVICE

(71) Applicant: Shanghai Tianma Micro-Electronics Co., Ltd., Shanghai (CN)

(72) Inventors: Feng Lu, Shanghai (CN); Takatori Kenichi, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 17 days.

(21) Appl. No.: 15/922,684

(22) Filed: Mar. 15, 2018

(65) Prior Publication Data

US 2019/0064987 A1 Feb. 28, 2019

(30) Foreign Application Priority Data

Aug. 25, 2017 (CN) .......................... 2017 1 0744046

(51) Int. Cl.
*G06F 3/041* (2006.01)
*H01L 27/32* (2006.01)
(Continued)

(52) U.S. Cl.
CPC ........ *G06F 3/0414* (2013.01); *G02F 1/13338* (2013.01); *G02F 1/133512* (2013.01);
(Continued)

(58) Field of Classification Search
CPC .... G06F 3/0414; G06F 3/0412; G06F 3/0416; G02F 1/13338; G02F 1/133512; G02F 1/133514; G02F 1/136213; H01L 27/323
(Continued)

(56) References Cited

U.S. PATENT DOCUMENTS 4,843,880 A * 7/1989 Sommer .................... G01P 5/14
73/170.14
8,758,273 B2 * 6/2014 Kubiak ................ A61B 5/1036
36/110
(Continued)

FOREIGN PATENT DOCUMENTS

JP 2005227039 A 8/2005
JP 2012509605 A 4/2012

OTHER PUBLICATIONS

Chinese Office Action, dated Nov. 28, 2019.

*Primary Examiner* — Fred Tzeng
(74) *Attorney, Agent, or Firm* — Alston & Bird LLP

(57) ABSTRACT

The present disclosure relates to the field of display technologies and provides a display panel and a display device, for lowering the risk of the force-sensing sensor being damaged by the electrostatic breakdown during the manufacture of the display panel. The display panel includes a force-sensing sensor and first to fourth input signal lines connected to the pressure-sensing sensor. At least one of the first input signal line, the second input signal line, the first output signal line and the second output signal line is a bridge. The bridge includes a first connection line connected to the force-sensing sensor and located in a first conduction layer, a second connection line located in a second conduction layer and connected to the first connection line through a first through-hole, a third connection line located in the first conduction layer and connected to the second connection line through a second through-hole.

12 Claims, 8 Drawing Sheets

(51) Int. Cl.
  *G02F 1/1333* (2006.01)
  *G02F 1/1335* (2006.01)
  *G02F 1/1362* (2006.01)

(52) U.S. Cl.
  CPC .. *G02F 1/133514* (2013.01); *G02F 1/136213* (2013.01); *G06F 3/0412* (2013.01); *G06F 3/0416* (2013.01); *H01L 27/323* (2013.01); *H01L 27/3225* (2013.01); *H01L 27/3276* (2013.01); *G02F 2201/121* (2013.01); *G02F 2201/123* (2013.01); *H01L 2251/5392* (2013.01)

(58) Field of Classification Search
  USPC .......................................................... 345/173
  See application file for complete search history.

(56) References Cited

U.S. PATENT DOCUMENTS

| | | | |
|---|---|---|---|
| 9,004,048 B2* | 4/2015 | Gates | G01M 15/10 123/568.11 |
| 9,488,541 B2* | 11/2016 | Fukuzawa | G01L 9/0051 |
| 2011/0298709 A1* | 12/2011 | Vaganov | G06F 3/03545 345/158 |
| 2014/0353614 A1 | 12/2014 | Park | |
| 2016/0048266 A1* | 2/2016 | Smith | G06F 3/0418 345/174 |
| 2016/0363491 A1* | 12/2016 | Iwase | A61B 5/447 |
| 2017/0003811 A1* | 1/2017 | Lu | G06F 3/0416 |
| 2017/0185211 A1* | 6/2017 | Lu | G06F 3/0412 |

* cited by examiner

DISPLAY PANEL AND DISPLAY DEVICE

CROSS-REFERENCE TO RELATED APPLICATIONS

The present application claims priority to Chinese Patent Application No. 201710744046.8, filed on Aug. 25, 2017, the content of which is incorporated herein by reference in its entirety.

TECHNICAL FIELD

The present disclosure relates to the field of display technologies, and particularly, to a display panel and a display device.

BACKGROUND

With the development of touch display technologies, in addition to the traditional touch technology that can detect the touch position, a force touch technology capable of detecting the force of the touch pressing is also available now. The force touch can achieve more convenient human-computer interaction. The force-sensing sensor is an essential element for realizing the force touch.

The force-sensing sensor is integrated on the display panel. A connection line is provided between the force-sensing sensor and a drive chip. The drive chip provides bias voltage for the force-sensing sensor via the connection line, and receives signal output from the force-sensing sensor via the connection line, in order to detect the force touch. However, due to the relatively long connection line between the force-sensing sensor and the drive chip, static electricity generated in the manufacturing process of the display panel can be easily transmitted to the force-sensing sensor, so that the force-sensing sensor may be destroyed by the electrostatic breakdown.

SUMMARY

The object of the present disclosure is to provide a display panel and a display device, thereby lowering the risk of the force-sensing sensor being damaged by the electrostatic breakdown in the manufacturing process of the display panel.

The present disclosure provides a display panel, including a force-sensing sensor located in a non-display area of the display panel, wherein the force-sensing sensor includes a first input, a second input, a first output and a second output; a first input signal line connected to the first input; a second input signal line connected to the second input; a first output signal line connected to the first output; and a second output signal line connected to the second output; wherein at least one of the first input signal line, the second input signal line, the first output signal line and the second output signal line is a bridge, wherein the bridge includes: a first connection line located in a first conduction layer and connected to the force-sensing sensor; a second connection line located in a second conduction layer and connected to the first connection line through a first through-hole; and a third connection line located in the first conduction layer and connected to the second connection line through a second through-hole.

The present disclosure further provides a display device including a display panel. The display panel includes the display panel as described above.

BRIEF DESCRIPTION OF DRAWINGS

In order to clarify the technical solutions in the embodiments of the present disclosure or in the related art, the accompanying drawings for describing the embodiments or the related art are briefly introduced as follows. The drawings in the following description illustrate some embodiments of the present disclosure, and those skilled in the art can derive other drawings from these without creative efforts.

DESCRIPTION OF EMBODIMENTS

In order to clarify the purposes, technical solutions and advantages of the embodiments of the present disclosure, the technical solutions of the embodiments are described in detail as below with reference to the accompanying drawings and embodiments. It should be understood that the embodiments described hereinafter are only a part of all the embodiments. On the basis of the embodiments in the present disclosure, all other embodiments that are derived by those skilled in the art without any creative efforts fall into the protection scope of the present disclosure.

The technical terms used in the embodiments of the present disclosure are merely used for the purpose of describing particular embodiments, but not intended to limit the present disclosure. The singular forms "a", "an" and "the" used in the embodiments of the present disclosure and the appended claims also include the meaning of the plural forms, unless otherwise noted.

Figure 1:
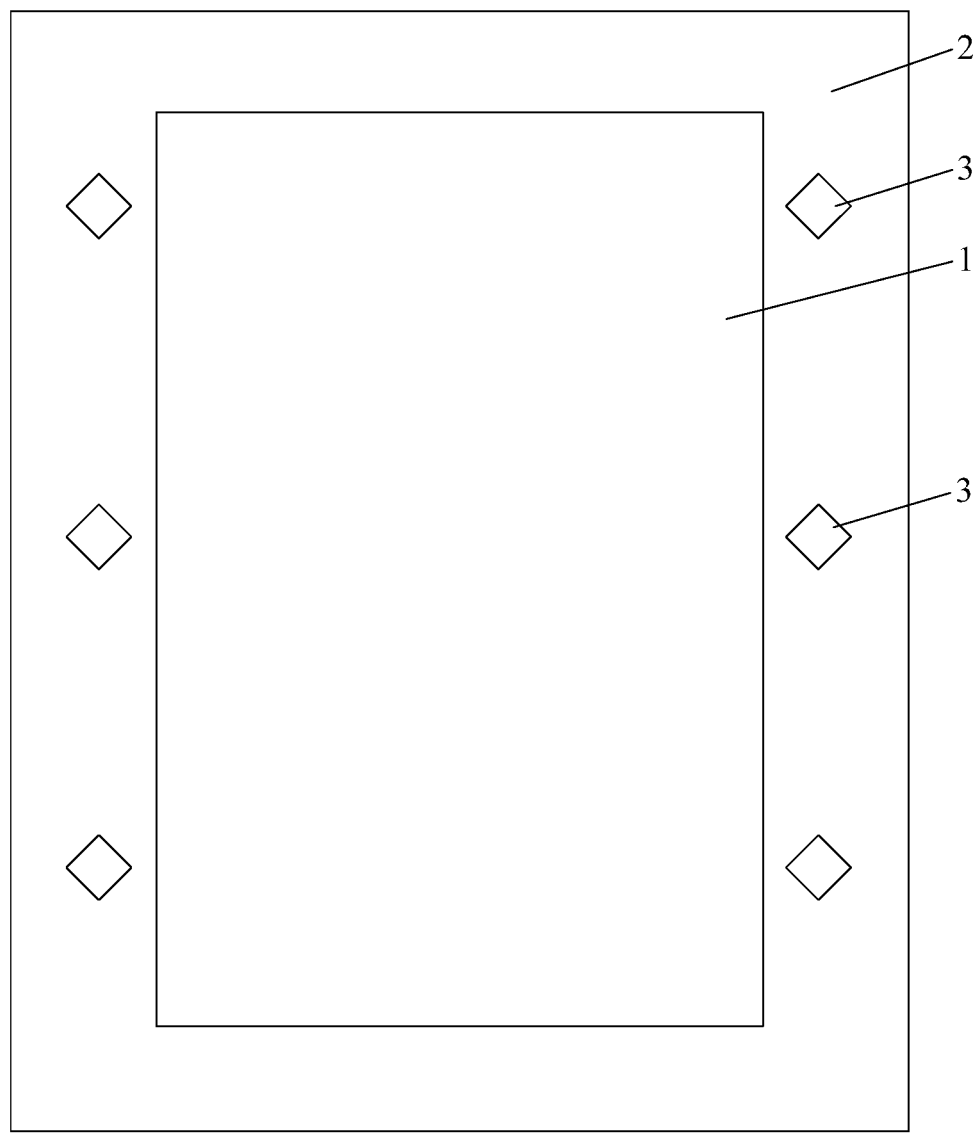
FIG. 1 illustrates a structural schematic diagram of a display panel according to an embodiment of the present disclosure.
Figure 2:
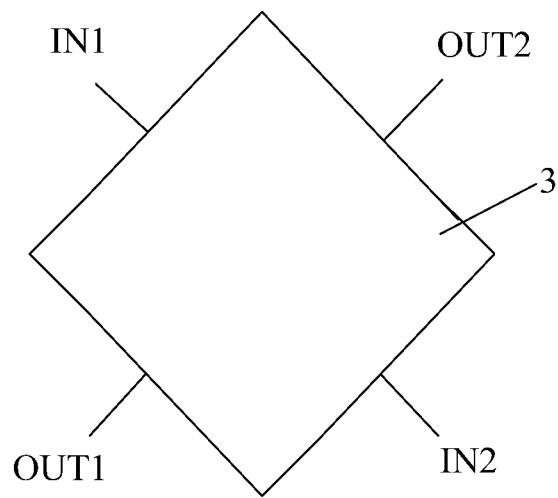
FIG. 2 illustrates an enlarged schematic diagram of a force-sensing sensor shown in FIG. 1.
Figure 3:
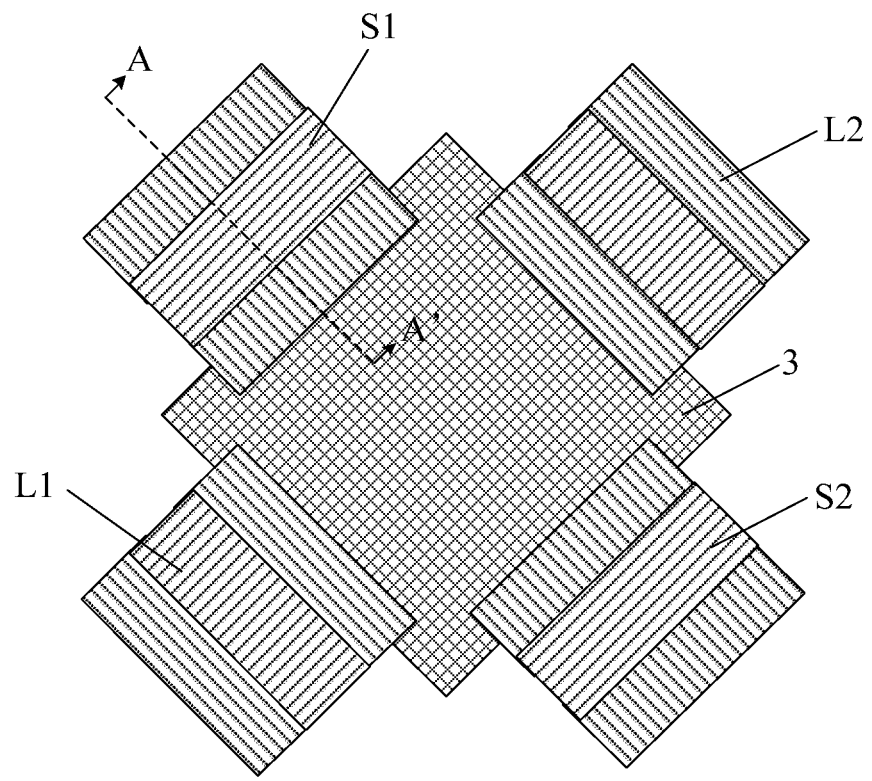
FIG. 3 illustrates an enlarged schematic diagram of the force-sensing sensor shown in FIG. 1 and signal lines associated with the force-sensing sensor.
Figure 4:
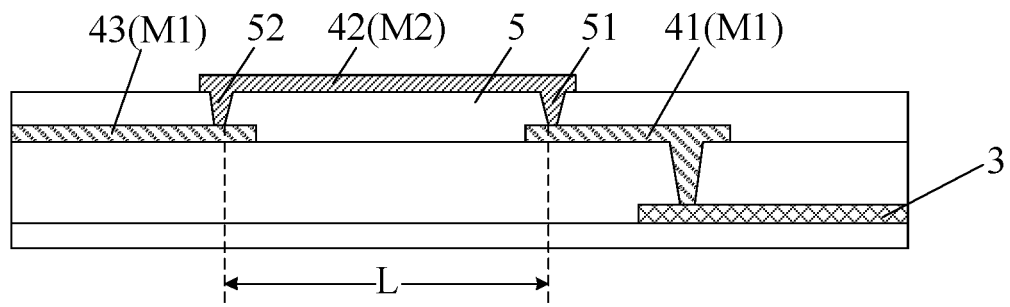
FIG. 4 illustrates a structural cross-sectional diagram along direction AA' in FIG. 3.

As shown in FIG. 1, which illustrates a structural schematic diagram of a display panel provided in an embodiment of the present disclosure, the display panel divided into a display area 1 and a non-display area 2. The display panel includes a force-sensing sensor 3 disposed in the non-display area 2. Generally, the display panel includes a plurality of force-sensing sensors 3 disposed in the non-display area 2. As shown in FIG. 2 and FIG. 3, wherein FIG. 2 illustrates an enlarged schematic diagram of the force-sensing sensor in FIG. 1 and FIG. 3 illustrates an enlarged schematic diagram of the force-sensing sensor shown in FIG. 1 and signal lines associated with the force-sensing sensor, each of the force-sensing sensors 3 includes a first input IN1, a second input IN2, a first output OUT1 and a second output OUT2. The display panel further includes a first input signal line S1 connected to the first input IN1, a second input signal line S2 connected to the second input IN2, a first output signal line L1 connected to the first output OUT1, and a second output signal line L2 connected to the second output OUT2. At least one of the first input signal line S1, the second input signal line S2, the first output signal line L1 and the second output signal line L2 is a bridge. As shown in FIG. 4, which illustrates a structural cross-sectional diagram along direction AA' in FIG. 3, the bridge includes a first connection line 41 located in a first conduction layer M1, a second connection line 42 located in a second conduction layer M2, and a third connection line 43 located in the first conduction layer M1. The first connection line is connected to the force-sensing sensor 3, the second connection line 42 is connected to the first connection line 41 through a first through-hole 51, and the third connection line 43 is connected to the second connection line 42 through a second through-hole 52.

An insulation layer 5 is provided between the first conduction layer M1 and the second conduction layer M2, and both the first through-hole 51 and the second through-hole 52 are through-holes in the insulation layer 5. The third connection line 43 is used to be connected to a drive chip from a position close to the force-sensing sensor 3, and then is communicated with the force-sensing sensor 3 through the second connection line 42 and the first connection line 41 in a bridge manner at the position close to the force-sensing sensor 3, thereby lowering the risk of the force-sensing sensor 3 being damaged by the electrostatic breakdown in the manufacturing process of the display panel. For example, the force-sensing sensor 3, and the first and third connection lines 41, 43 in the first conduction layer M1 are firstly prepared. Before producing the second connection line 42 in the second conduction layer M2, since the third connection line 43 is provided along the periphery of the display panel and extends to the bottom of the display panel to be connected to the drive chip at the bottom of the display panel, the static electricity generated in the manufacturing process can be easily transmitted to the third connection line 43, but cannot be transmitted to the force-sensing sensor 3, as the connection line 43 is not connected to the force-sensing sensor 3 at this moment.

In the display panel according to the present embodiment, the signal lines for the force-sensing sensor are provided in a bridge connection manner at a position close to the force-sensing sensor, i.e., the first connection line in the first conduction layer is connected to the force-sensing sensor, the second connection line in the second conduction layer is connected to the first connection line through the first through-hole, and the third connection line in the first conduction layer is connected to the second connection line through the second through-hole. The signal lines for the force-sensing sensor formed in such a manner that the previously prepared connection lines won't transmit the static electricity to the force-sensing sensor, thereby lowering the risk of the display panel being damaged by the electrostatic breakdown in the manufacturing process.

In an embodiment, as shown in FIG. 4, the second connection line 42 is made of indium tin oxide (ITO), and an extension length L of the second connection line 42 between the first through-hole 51 and the second through-hole 52 is greater than 50 μm and smaller than 200 μm.

Figure 9:
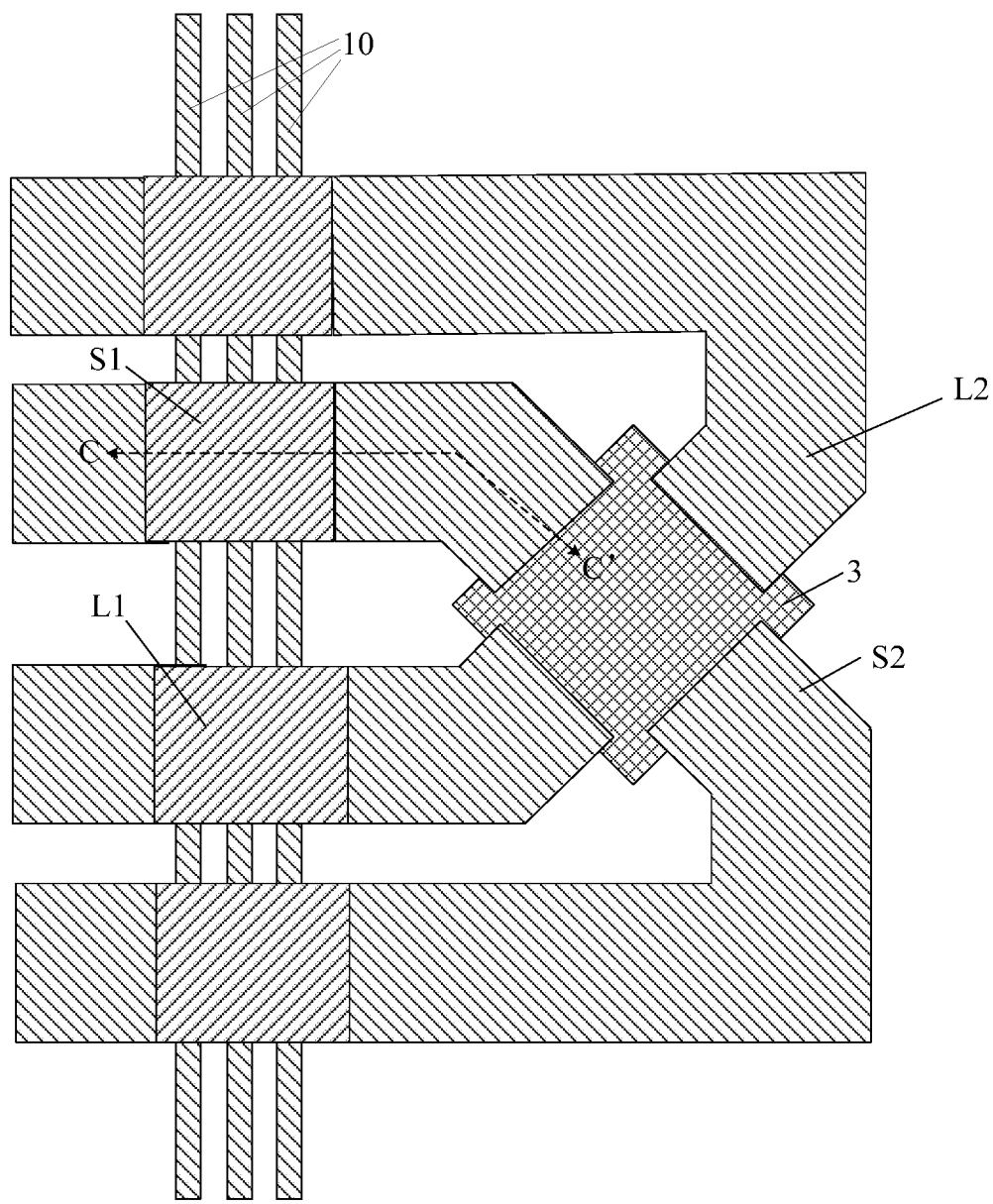
FIG. 9 illustrates another enlarged schematic diagram of the force-sensing sensor shown in FIG. 1 and signal lines associated with the force-sensing sensor.

On the one hand, as shown in FIG. 1, the force-sensing sensor 3 is located in the non-display area 2 of the display panel. When the display panel is a liquid crystal display panel, the non-display area 2 needs to be provided with a sealant for sealing the liquid crystal. Laser irradiation is required during curing of the sealant. The second connection line 42 made of ITO is a transparent connection line, which does not block the irradiation of laser and thus is more conducive to the curing of the sealant. On the other hand, a gate drive circuit (not shown) is usually placed in the non-display area 2 of the display panel. The gate drive circuit includes a plurality of cascaded shift registers. The force-sensing sensor 3 is usually arranged between two adjacent shift registers, and the distance between two adjacent shift registers is about 100 μm. FIG. 9 illustrates another enlarged schematic diagram of a force-sensing sensor shown in FIG. 1 and signal lines associated with the force-sensing sensor. As shown in FIG. 9, the first input signal line S1, the second input signal line S2, the first output signal line L1 and the fourth output signal line L2, which are associated with the force-sensing sensor 3, are usually led out from a same side of the force-sensing sensor 3. Therefore, the width of each signal line, without taking the space between the four signal lines into account, is about 20 μm, i.e., the width of the second connection line 42 is about 20 μm. The square resistance of the ITO is about 100Ω. The resistance between the first input IN1 and the second input IN2 of the force-sensing sensor 3 is Ra, and the resistance between the first output OUT1 and the second output OUT2 of the force-sensing sensor 3 is Rb, wherein Ra=Rb, and Ra is usually greater than 500Ω and smaller than 2000Ω. After the signal lines for the force-sensing sensor 3 are formed, if the transmission of the static electricity to the force-sensing sensor 3 still exists, the resistance of the second connection line 42 may be adjusted into a larger value for limiting current and reducing the heat generated by the force-sensing sensor 3. Thus, the problem that the force-sensing sensor 3 generates too much heat at a high current is solved to some extent. In the meantime, the resistance of the second connection line 42 should not be too great, in order to prevent the voltage component of the second connection line 42 from being excessively great during the operation of the force-sensing sensor 3. In consideration of the above two reasons, Ra may be set to be equal to twice the resistance of the second connection line 42. In this setting manner, on the basis of that the resistance value of the second connection line 42 is Rito, and $$Rito = \frac{Rs \times L}{W},$$

where Rs is the square resistance of the second connection line 42, L is the length of the second connection line 42, and W is the width of the second connection line 42, if Ra is equal to twice the resistance value of the second connection line 42, the following equation is deduced:

$$Ra = 2 \times Rito = \frac{2 \times 100 \times L}{20} = 10L.$$

Thus, when Ra is 500Ω, L=50 μm; and when Ra is 2000Ω, L is 200 μm. Since Ra is greater than 500 Ω and smaller than 2000Ω, L is greater than 50 μm and smaller than 200 μm.

In an embodiment, the force-sensing sensor 3 is made of a semiconductor material.

Compared with the force-sensing sensor 3 made of a metal material, the force-sensing sensor 3 made of the semiconductor material has a greater change in resistance under force strain and thus has a higher level of sensitivity.

Figure 5:
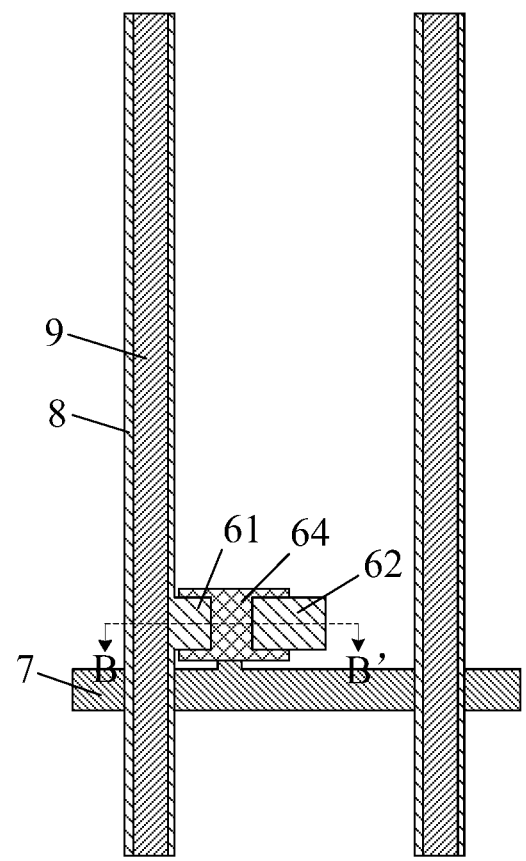
FIG. 5 illustrates an enlarged schematic diagram of a part of a display area in the display panel shown in FIG. 1.
Figure 6:
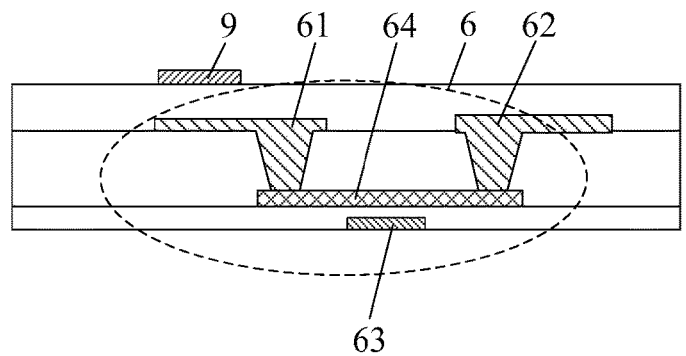
FIG. 6 illustrates a schematic cross-sectional diagram along direction BB' in FIG. 5.
Figure 7:
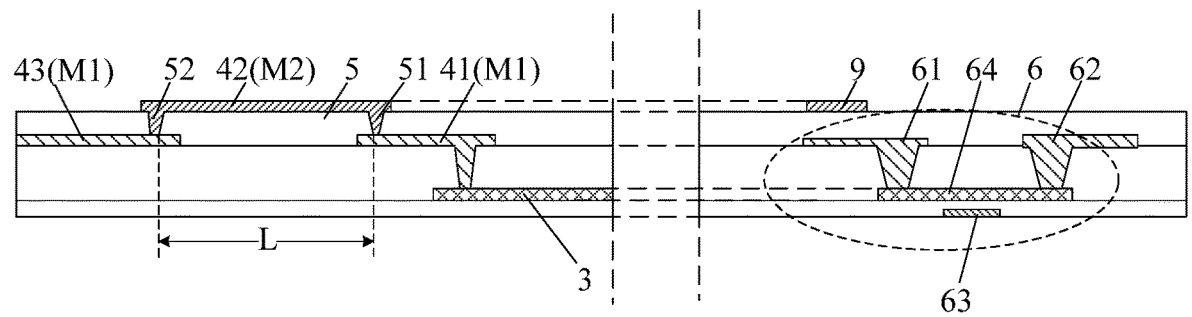
FIG. 7 illustrates a schematic diagram for comparing the structures shown in FIG. 4 and FIG. 6.

Another embodiment is shown in FIGS. 5-7. FIG. 5 illustrates an enlarged schematic diagram of a part of the display area in the display panel in FIG. 1. FIG. 6 illustrates a schematic cross-sectional diagram along direction BB' in FIG. 5. FIG. 7 illustrates a schematic diagram for comparing the structures shown in FIG. 4 and FIG. 6.

The above-mentioned display panel further includes: a thin film transistor 6 including a source electrode 61, a drain electrode 62, a gate electrode 63 and an active layer 64. Referring to FIG. 4 and FIG. 6, the force-sensing sensor 3 and the active layer 64 are located in a same layer.

As shown in FIG. 5 and FIG. 6, for example, if the display panel is a liquid crystal display panel, the display panel includes a plurality of gate lines 7 and a plurality of data lines 8. The plurality of gate lines 7 and the plurality of data lines 8 intersect with one another and define a plurality of sub-pixel units arranged in an array. Each of the sub-pixel units includes a thin film transistor 6 and a pixel electrode (not shown). The source electrode 61 of the thin film transistor 6 is connected to the associated data line 6. The drain electrode 62 of the thin film transistor 6 is connected to the associated pixel electrode, and the gate electrode 63 of the thin film transistor 6 is connected to the associated gate line 7. The liquid crystal display panel includes an array substrate, a color film substrate opposite to the array substrate, and a liquid crystal layer disposed between the array substrate and the color filter substrate. The data lines 8 are used to transmit data signals and the gate lines 7 are used to transmit scan signals. During the operation of the liquid crystal display panel, the thin film transistors 6 associated with the plurality of gate lines 7 are sequentially turned on row by row under the control of the scan signals. In the meantime, the data lines 8 sequentially transmit the data signals to the associated pixel electrodes, so that the pixel electrodes are charged. An electric field formed between the pixel electrode and the common electrode drives the liquid crystal in the liquid crystal layer to deflect, thereby achieving the normal display. The color film substrate includes a grid-shaped black matrix, and a plurality of color filters arranged in openings of the black matrix in an array manner. The color filters include red color filters, green color filters, and blue color filters.

It should be understood that other types of display panels are also possible in other achievable embodiments. The present disclosure does not limit the type of the display panel.

Figure 8:
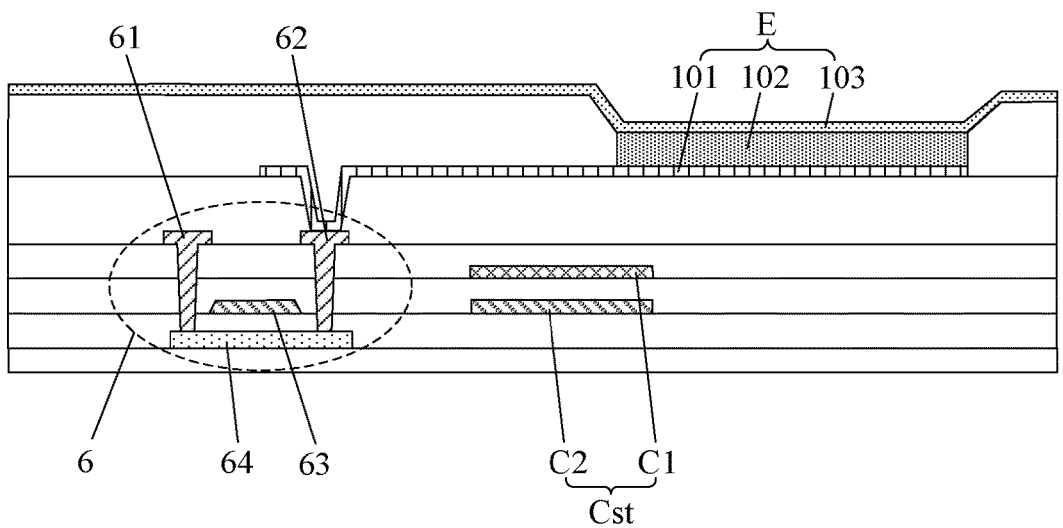
FIG. 8 illustrates a partial structural cross-sectional diagram of an organic light-emitting display panel according to an embodiment of the present disclosure.

For example, the display panel is an organic light-emitting display panel. The organic light-emitting display panel includes an array substrate, and the array substrate includes a plurality of pixel circuits. The organic light-emitting display panel further includes a plurality of organic light-emitting diodes (OLED) disposed on the array substrate. An anode of each organic light-emitting diode is electrically connected to an associated pixel circuit on the array substrate, as shown in FIG. 8. FIG. 8 illustrates a partial structural cross-sectional diagram of an organic light-emitting display panel according to an embodiment of the present disclosure. The organic light-emitting diodes E each includes an anode layer 101, a light-emitting layer 102 and a cathode layer 103, and the anode layer 101, the light-emitting layer 102 and the cathode layer 103 are arranged in sequence along a direction away from the array substrate. Each pixel circuit includes a thin film transistor 6. The thin film transistor 6 further includes a source electrode 61, a drain electrode 62, a gate electrode 63 and an active layer 64. Each pixel circuit further includes a storage capacitor Cst. The storage capacitor Cst includes a first electrode plate C1 and a second electrode plate C2. The gate electrode 63 and the second electrode plate C2 are located in the first conduction layer, the first electrode plate C1 is located in the second conduction layer, and the source electrode 61 and the drain electrode 62 are located in the third conduction layer. The third conduction layer, the second conduction layer and the first conduction layer are sequentially arranged on a side of the anode layer 102 away from the cathode layer 103 along a direction away from the side of the anode layer 102. The anode layer 101 of an organic light-emitting diode E is connected to the drain electrode 62 of an associated thin film transistor through a through-hole. The plurality of light-emitting diodes includes light-emitting diodes for emitting red light, light-emitting diodes for emitting green light, and light-emitting diodes for emitting blue light. In addition, the organic light-emitting display panel further includes an encapsulation layer covering the plurality of light-emitting diodes. It should be noted that FIG. 8 merely schematically illustrates the storage capacitor Cst in the pixel circuit and one thin film transistor 6 directly connected to the organic light emitting diode E. The layer structure of the other transistors may be the same as said thin film transistor 6. In addition, the relation of the layers is not limited to that shown in FIG. 8. For example, the first electrode plate C1 and the second electrode plate C2 may be formed in other layers, as long as they are two electrode plates capable of forming the capacitor. If the organic light-emitting diode E is a top emission structure, i.e., the organic light-emitting diode E emits light from a side of the cathode layer 103 away from the anode layer 101, each element in the pixel drive circuit can be arranged under the organic light-emitting diode E. If the organic light-emitting diode E is a bottom emission structure, i.e., the organic light-emitting diode E emits light from a side of the anode layer 101 away from the cathode layer 103, each element in the pixel drive circuit should be arranged outside the light-emitting area of the organic light-emitting diode E, in order to prevent negative effects on display.

For example, the display panel is a micro light-emitting diode display panel. The micro light-emitting diode display panel includes an array substrate, and the array substrate includes a plurality of pixel circuits. The micro light-emitting diode display panel further includes a plurality of micro light-emitting diodes (Mic-LEDs) arranged on the array substrate. An anode of each micro light-emitting diode is electrically connected to an associated pixel circuit on the array substrate. The plurality of micro light-emitting diodes include micro light-emitting diodes for emitting red light, micro light-emitting diodes for emitting green light and micro light-emitting diodes for emitting blue light. The micro light-emitting diodes can be formed on an underlay substrate, and subsequently transferred to the array substrate.

In an embodiment, as shown in FIGS. 4-7, the first conduction layer M1 and the second conduction layer M2 are any two different layers selected from: a gate electrode metal layer, a source-drain electrode metal layer and a touch signal line metal layer.

Taking the liquid crystal display panel as an example, the gate electrode metal layer includes gate lines 7 and gate electrodes 63, the source-drain electrode metal layer includes source electrodes 61, drain electrodes 62 and data lines 8. The touch signal line metal layer includes touch signal lines 9. A common electrode includes a plurality of common electrode blocks distributed in a matrix. Each common electrode block is connected to at least one touch signal line 9. During the display phase, the touch signal lines 9 output common electrode signal to all of the common electrode blocks. In the touch phase, the common electrode blocks are further used as touch electrodes, so that the touch signal lines 9 output touch drive signals to all of the common electrode blocks and receive sensing signals from all of the common electrode blocks to determine the touch position (s). It should be noted that FIG. 4 and FIG. 7 merely illustrate that the first conduction layer M1 is the source-drain electrode metal layer and the second conduction layer M2 is the touch signal line metal layer, which is actually not limited in the embodiments of the present disclosure.

Figure 10:
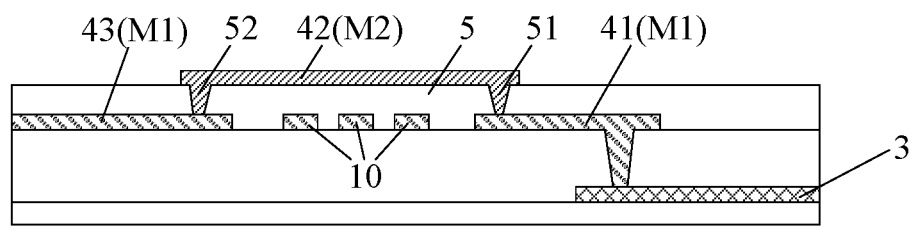
FIG. 10 illustrates a structural cross-sectional diagram along direction CC' in FIG. 9.

Another embodiment is shown in FIG. 9 and FIG. 10. FIG. 10 illustrates a structural cross-sectional diagram along direction CC' in FIG. 9, gate drive circuits (not shown) and gate drive circuit signal lines 10 connected to the gate drive circuits are placed in the non-display area. The gate drive circuit signal lines 10 are located in the first conduction layer M1, an orthographic projection of the second connection lines 42 intersects with the orthographic projection of the gate drive circuit signal lines 10 on the plane where the display panel is located.

In order to save the process steps, the gate drive circuit signal line 10, the first connection line 41 and the third connection line 43 can be all located in the first conduction layer M1. In this way, the gate drive circuit signal line 10, the first connection line 41 and the third connection line 43 can be formed in a same patterning process. The gate drive circuit includes cascaded multi-stage shift registers. The multi-stage shift registers are arranged along the edge of the display panel. The force-sensing sensor 3 is provided near the gate drive circuit, so that the gate drive circuit signal lines 10 need to run round the force-sensing sensor 3. For more convenient wiring, the gate drive circuit signal lines 10 can pass through the bridge portion of the associated signal lines for the force-sensing sensor 3, i.e., the gate drive circuit signal lines 10 pass through the location of the second connection line 42. The gate drive circuit signal lines 10 may also be formed in the gate electrode metal layer in another possible embodiment. As the second conduction layer M2 is relatively far from the gate electrode metal layer, the load capacitance between the signal lines associated with the force-sensing sensor 3 and the gate drive circuit signal lines 10 is further reduced in a manner that the gate drive circuit signal lines 10 pass through the location of the second connection line 42.

Figure 11:
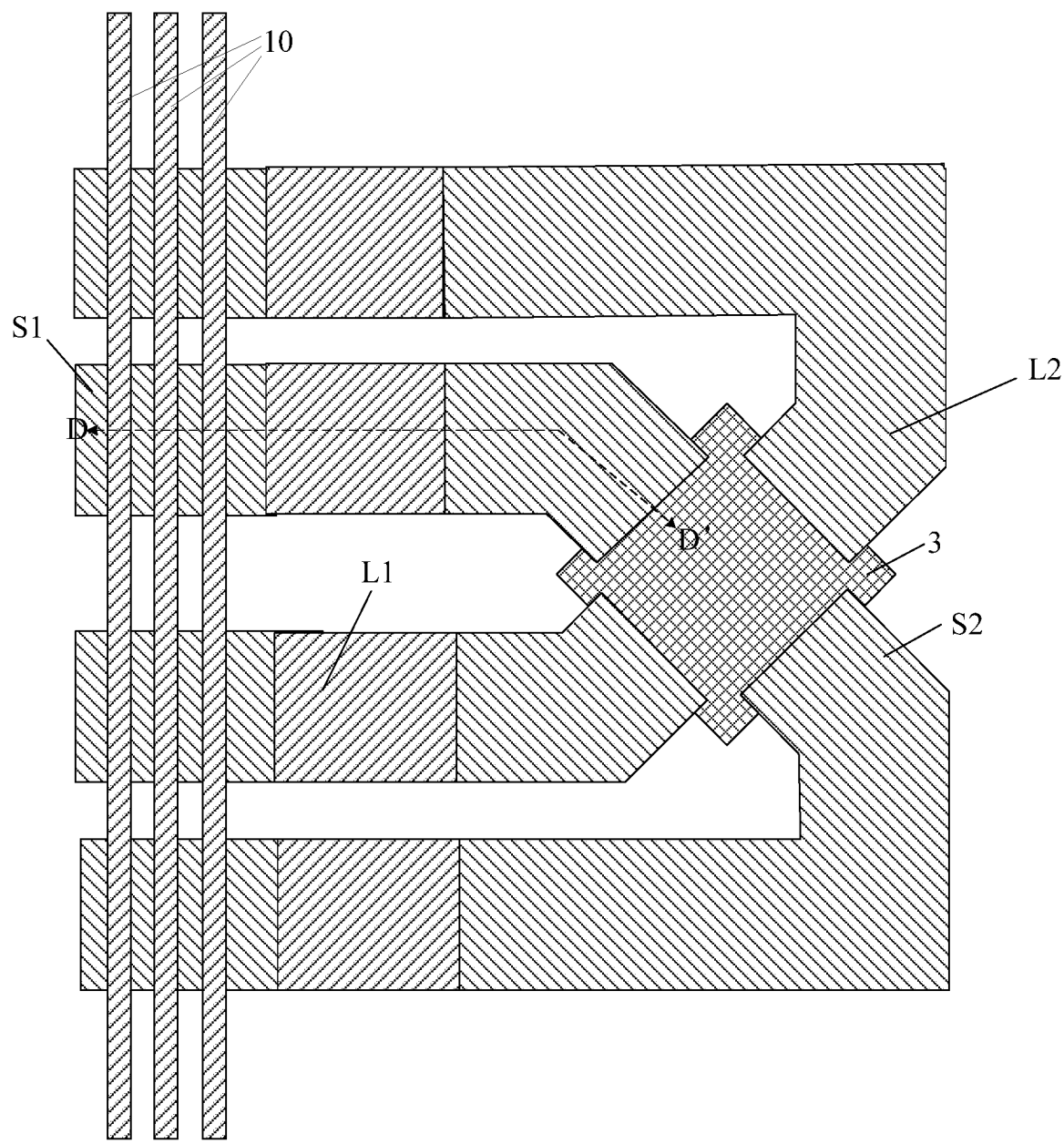
FIG. 11 illustrates another enlarged schematic diagram of the force-sensing sensor shown in FIG. 1 and signal lines associated with the force-sensing sensor.
Figure 12:
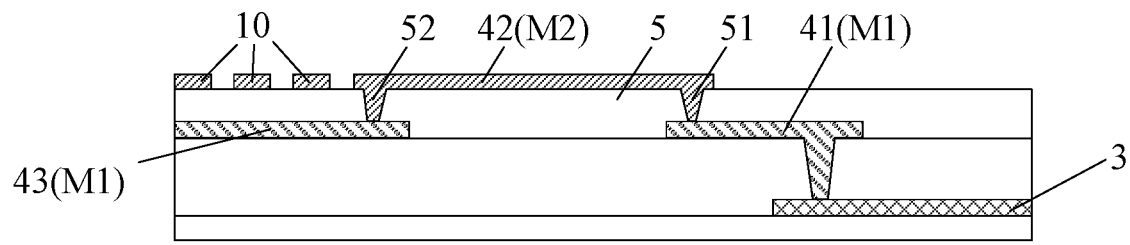
FIG. 12 illustrates a structural cross-sectional diagram along direction DD' in FIG. 11.

FIG. 11 illustrates an enlarged schematic diagram of the force-sensing sensor shown in FIG. 1 and signal lines associated with the force-sensing sensor, and FIG. 12 illustrates a structural cross-sectional diagram along direction DD' in FIG. 11. In an embodiment shown in FIG. 11 and FIG. 12, gate drive circuits and gate drive circuit signal lines 10 are placed in the non-display. The minimum distance between the force-sensing sensor 3 and the gate drive circuit signal line 10 is 50 µm or greater.

The gate drive circuit signal lines 10 may be relatively longer and distributed along the edges of the display panel to be connected to the drive chip at the bottom end of the display panel. Therefore, in order to prevent the force-sensing sensor 3 from being broken by the static electricity on the gate drive circuit signal lines 10 and avoid the interaction between the gate drive circuit signal lines 10 and the force-sensing sensor 3, the minimum distance between the force-sensing sensor 3 and the gate drive circuit signal line 10 is set to be 50 µm or greater. In order to save the process step, the gate drive circuit signal lines 10 and the second connection line 42 can be located in the second conduction layer M2. In such way, the gate drive circuit signal lines 10 and the second connection line 42 can be formed in the same patterning process. The gate drive circuit signal lines 10 may also be formed in the first conduction layer M1 or in the gate electrode metal layer in other possible embodiments.

Figure 13:
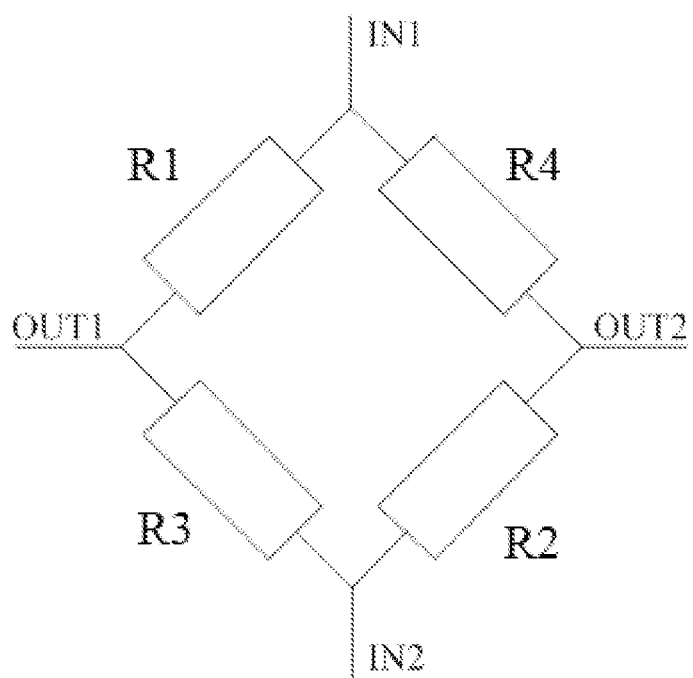
FIG. 13 illustrates a structural schematic diagram of a force-sensing sensor according to an embodiment of the present disclosure.

FIG. 13 illustrates a structural schematic diagram of a force-sensing sensor according to an embodiment of the present disclosure. In the embodiment shown in FIG. 13, the force-sensing sensor is a Wheatstone bridge force-sensing sensor. The Wheatstone bridge force-sensing sensor includes a first input IN1, a second input IN2, a first output OUT1, a second output OUT2, a first strain force-sensing sensor R1, a second strain force-sensing sensor R2, a third strain force-sensing sensor R3 and a fourth strain force-sensing sensor R4. In each Wheatstone bridge force-sensing sensor, the first strain force-sensing sensor R1 is series-connected between the first input IN1 and the first output OUT1, the second strain force-sensing sensor R2 is series-connected between the second input IN2 and the second output OUT2, the third strain force-sensing sensor R3 is series-connected between the second input IN2 and the first output OUT1, and the fourth strain force-sensing sensor R4 is series-connected between the first input IN1 and the second output OUT2.

In the embodiment shown in FIG. 3, the force-sensing sensor is a silicon piezoresistive force sensor. The silicon piezoresistive force sensor may be a quadrangular structure. The four sides of the quadrangular structure are connected with the first input IN1, the second input IN2, the first output OUT1 and the second output OUT2, respectively. The first input IN1 and the second input IN2 are connected to two opposite edges, respectively; and the first output OUT1 and the second output OUT2 are connected to two other opposite sides, respectively.

It should be noted that both the force-sensing sensor structure shown in FIG. 2 and the force-sensing sensor structure shown in FIG. 13 can be equivalent to an electric bridge including a first bridge arm, a second bridge arm, a third bridge arm and a fourth bridge arm. The first to fourth bridge arms are connected head to tail sequentially. The first input IN1 is the junction of the first bridge arm and the fourth bridge arm, the second input IN2 is the junction of the second bridge arm and the third bridge arm, the first output OUT1 is the junction of the first bridge arm and the second bridge arm, and the second output OUT2 is the junction of the third bridge arm and the fourth bridge arm. The electric bridge reaches an equilibrium state in which the voltage value at the first output OUT1 is equal to the voltage value at the second output OUT2, when the display panel is undeformed and the resistance value ratio of the first bridge arm to the second bridge arm is equal to the resistance value ratio of the fourth bridge arm to the third bridge arm. When the display panel is deformed and thus the four bridge arms are all deformed, the resistance value of each bridge arm is changed, thereby breaking the equilibrium state. That is, the resistance value ratio of the first bridge arm to the second bridge arm is unequal to the resistance value ratio of the fourth bridge arm to the third bridge arm, and the voltage value at the first output OUT1 is unequal to the voltage values at the second output OUT2. The difference between the voltage value at the first output OUT1 and the voltage value at the second output OUT2 is correlated with the force value applied on the display panel. During the force detection process, the corresponding force value applied on the display panel can be determined by obtaining the voltage value at the first output OUT1 and the voltage value at the second output OUT2.

In an embodiment, the force-sensing sensor 3 is made of polysilicon.

Due to a large resistance and a low melting point of polysilicon, the force-sensitive sensor 3 is easily burned down when a large current caused by static electricity passes through the polysilicon. Therefore, the force-sensing sensor 3 made of polysilicon material is more suitable for the embodiments of the present disclosure.

In the embodiment shown in FIG. 1, the display panel is divided into the display area 1 and the non-display area 2 surrounding the display area 1, and the force-sensing sensors 3 are located in a side part of the non-display area 2 close to the display area 1.

When the display panel is pressed, the closer a position of the display panel is to the center of the display panel, the greater the deformation of the position. Therefore, in order to improve the force-sensing effect of the force-sensing sensor 3, the force-sensing sensor 3 is placed in the side part of the non-display area 2 close to the display area 1. In this way, pressing can produce a greater deformation to make the sensor more sensitive, without adversely affecting the normal display effect.

Figure 14:
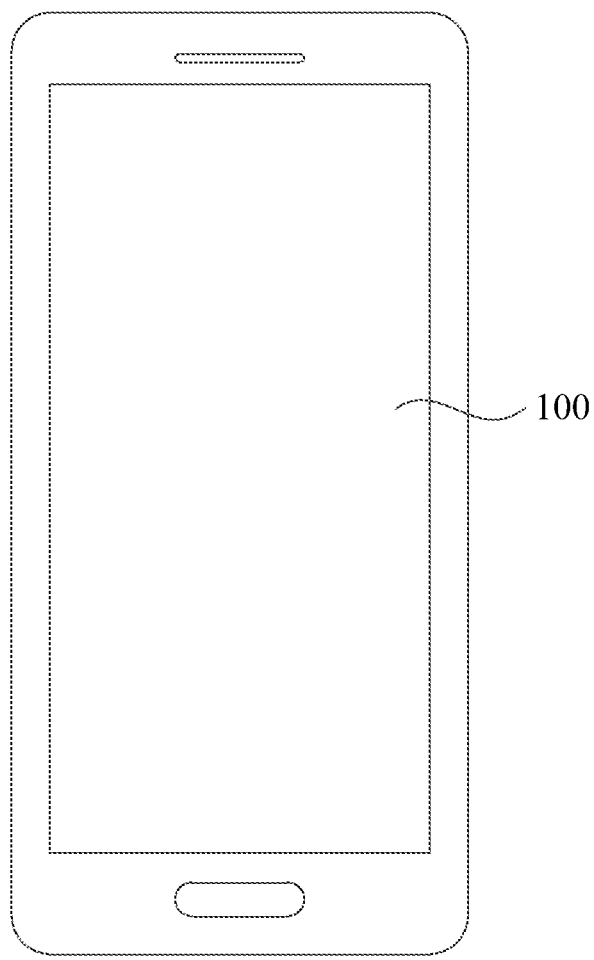
FIG. 14 illustrates a structural schematic diagram of a display device according to an embodiment of the present disclosure.

FIG. 14 illustrates a structural schematic diagram of a display device provided in an embodiment of the present disclosure. The display device includes the display panel 100 described in any embodiment above.

The specific structure and principle of the display panel 100 are similar to those mentioned in the above embodiments, which will not be repeated herein. The display device can be a touch panel, a mobile phone, a tablet computer, a portable computer, a television or any other electronic device with display function.

In the display device according to the embodiments of the present disclosure, the signal lines for the force-sensing sensor are disposed in a bridge connection manner at a position close to the force-sensing sensor, i.e., the signal lines for the force-sensing sensor are formed in a manner that the first connection line in the first conduction layer is connected to the force-sensing sensor, the second connection line in the second conduction layer is connected to the first connection line through the first through-hole, and the third connection line in the first conduction layer is connected to the second connection line through the second through-hole. Therefore, the earlier prepared connection lines are prevented from transmitting the static electricity to the force-sensing sensor, thereby lowering the risk of the force-sensing sensor being damaged by the electrostatic breakdown in the manufacturing process of the display panel.

It should be noted that the above embodiments are merely used to explain the technical solutions of the present disclosure, but not intended to limit the present disclosure. Although the present disclosure is described in detail with reference to these embodiments, it should be understood that, those skilled in the art are able to modify the technical solutions described in the embodiments or equivalently replace parts of or all technical features, without departing from the substantial protection scope of the present disclosure.

What is claimed is:

1. A display panel, comprising:
    a force-sensing sensor located in a non-display area of the display panel, wherein the force-sensing sensor comprises a first input, a second input, a first output and a second output;
    wherein the display panel further comprises:
    a first input signal line connected to the first input;
    a second input signal line connected to the second input;
    a first output signal line connected to the first output; and
    a second output signal line connected to the second output;
    wherein at least one of the first input signal line, the second input signal line, the first output signal line and the second output signal line is a bridge,
    wherein the bridge comprises:
    a first connection line located in a first conduction layer and connected to the force-sensing sensor;
    a second connection line located in a second conduction layer and connected to the first connection line through a first through-hole; and
    a third connection line located in the first conduction layer and connected to the second connection line through a second through-hole, wherein the third connection line is configured to be connected to a drive chip, and wherein the force-sensing sensor is configured to be connected to the drive chip through the first connection line, the second connection line, and the third connection line in sequence.

2. The display panel according to claim 1, wherein the second connection line is made of indium tin oxide; and
    wherein an extension length of the second connection line between the first through-hole and the second through-hole is greater than 50 μm and smaller than 200 μm.

3. The display panel according to claim 1, wherein the force-sensing sensor is made of a semiconductor material.

4. The display panel according to claim 1, further comprising a thin film transistor, wherein the thin film transistor comprises a source electrode, a drain electrode, a gate electrode and an active layer, and the force-sensing sensor and the active layer are located in a same layer.

5. The display panel according to claim 4, wherein the first conduction layer and the second conduction layer are any two different layers selected from: a gate electrode metal layer, a source-drain electrode metal layer and a touch signal line metal layer.

6. The display panel according to claim 5, further comprising a gate drive circuit and a gate drive circuit signal line connected to the gate drive circuit, wherein the gate drive circuit and the gate drive circuit signal line are provided in the non-display area; and
    wherein the gate drive circuit signal line is located in the first conduction layer, and an orthographic projection of the second connection line intersects with an orthographic projection of the gate drive circuit signal line on a plane where the display panel is located.

7. The display panel according to claim 1, further comprising a gate drive circuit and a gate drive circuit signal line connected to the gate drive circuit, wherein the gate drive circuit and the gate drive circuit signal line are formed in the non-display area; and
    wherein a minimum distance between the force-sensing sensor and the gate drive circuit signal line is 50 μm or greater.

8. The display panel according to claim 1, wherein the force-sensing sensor is a Wheatstone bridge force-sensing sensor;
- wherein the Wheatstone bridge force-sensing sensor comprises the first input, the second input, the first output, the second output, a first strain force-sensing sensor, a second strain force-sensing sensor, a third strain force-sensing sensor and a fourth strain force-sensing sensor; and
- wherein the first strain force-sensing sensor is series-connected between the first input and the first output, the second strain force-sensing sensor is series-connected between the second input and the second output, the third strain force-sensing sensor is series-connected between the second input and the first output, and the fourth strain force-sensing sensor is series-connected between the first input and the second output.

9. The display panel according to claim 1, wherein the force-sensing sensor is a silicon piezoresistive force sensor.

10. The display panel according to claim 1, wherein the force-sensing sensor is made of polysilicon.

11. The display panel according to claim 1, wherein the display panel further has a display area, and the non-display area surrounds the display area; and
- wherein the force-sensing sensor is located in a side part of the non-display area close to the display area.

12. A display device, comprising a display panel, wherein the display panel comprises:
- a force-sensing sensor located in a non-display area of the display panel, wherein the force-sensing sensor comprises a first input, a second input, a first output and a second output;
- wherein the display panel further comprises:
- a first input signal line connected to the first input;
- a second input signal line connected to the second input;
- a first output signal line connected to the first output; and
- a second output signal line connected to the second output;
- wherein at least one of the first input signal line, the second input signal line, the first output signal line and the second output signal line is a bridge;
- wherein the bridge comprises:
- a first connection line located in a first conduction layer and connected to the force-sensing sensor;
- a second connection line located in a second conduction layer and connected to the first connection line through a first through-hole; and
- a third connection line located in the first conduction layer and connected to the second connection line through a second through-hole, wherein the third connection line is configured to be connected to a drive chip, and the force-sensing sensor is configured to be connected to the drive chip through the first connection line, the second connection line and the third connection line in sequence.

* * * * *